United States Patent [19]

Pelc

[11] Patent Number: 4,952,876

[45] Date of Patent: Aug. 28, 1990

[54] VARIABLE BANDWIDTH MULTIECHO NMR IMAGING

[75] Inventor: Norbert J. Pelc, Wauwatosa, Wis.

[73] Assignee: General Electric Company, Milwaukee, Wis.

[21] Appl. No.: 420,715

[22] Filed: Oct. 12, 1989

Related U.S. Application Data

[63] Continuation of Ser. No. 276,088, Nov. 23, 1988, abandoned.

[51] Int. Cl.$^5$ ............................................. G01R 33/20
[52] U.S. Cl. ..................................................... 324/309
[58] Field of Search .......................... 324/307, 309, 311

[56] References Cited

U.S. PATENT DOCUMENTS

| | | | |
|---|---|---|---|
| 4,769,603 | 9/1988 | Oppelt et al. | 324/309 |
| 4,796,635 | 1/1989 | Dumoulin | 324/309 |
| 4,859,945 | 8/1989 | Stokar | 324/309 |

Primary Examiner—Michael J. Tokar
Assistant Examiner—Kevin D. O'Shea
Attorney, Agent, or Firm—Quarles & Brady

[57] ABSTRACT

A multiecho NMR pulse sequence is modified such that the bandwidth of the encoded NMR echo signal is reduced for the second NMR echo signal. This reduction is achieved by reducing the magnitude of the read-out magnetic field gradient, increasing the duration of the acquisition by a proportional amount and decreasing the sample rate by a proportional amount for the second NMR echo signal.

2 Claims, 4 Drawing Sheets

VARIABLE BANDWIDTH MULTIECHO NMR IMAGING

This application is a continuation of application Ser. No. 07/276,088, filed 11/23/88, abandoned.

BACKGROUND OF THE INVENTION

This invention relates to nuclear magnetic resonance (NMR) imaging techniques. More specifically, this invention relates to the acquisition of a plurality of NMR signals during a single pulse sequence in which the NMR signals are acquired at different effective bandwidths.

The nuclear magnetic resonance phenomenon has been utilized in the past in high resolution magnetic resonance spectroscopy instruments by structural chemists to analyze the structure of chemical compositions. More recently, NMR has been developed as a medical diagnostic modality having applications in imaging the anatomy. As is now well known, the NMR phenomenon can be excited within an object, such as a human patient, by applying a homogeneous polarizing magnetic field, $B_0$, and by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or a different RF coil is used to detect the NMR signals, frequently in the form of spin echoes, emanating from the patient lying within the field of the RF coil. In the course of a complete NMR scan, a plurality of NMR signals are typically observed. The NMR signals are used to reconstruct an NMR image.

The most common method for producing an image using NMR is to spatially encode the NMR signal using magnetic field gradients. In one such method referred to as "spin warp", for example, a phase encoding gradient field $G_y$ is applied to impart a phase change to the spin which is a function of the position of the spin along the y axis. During the subsequent acquisition of the NMR signal, a second position encoding gradient field $G_x$ (i.e. the "read-out gradient") is applied to continuously change the phase of the NMR signal as it is sampled. The amount of phase change between samples is a function of the location of the spin along the x axis. By performing a series of such measurements, or "views", with different values for the phase encoding gradient $G_y$, a two-dimensional array of NMR sample data is acquired. An image of the spin density in the x-y plane can be constructed by performing an inverse Fourier transform on this data.

There are three important factors in this NMR method which influence the quality of the reconstructed image: signal-to-noise ratio; aliasing artifacts; and chemical shift artifacts. The signal-to-noise ratio (SNR) of the acquired NMR signals is critical if noise in the image is to be kept to acceptable levels. One method of doing this is to reduce the bandwidth of the encoded NMR signals by using a weaker read-out gradient. Unfortunately, a reduction in the bandwidth of the encoded NMR signal by weakening the read-out gradient increases chemical shift artifacts. The reason for this is that the problem of chemical shift artifacts is inversely related to the read-out gradient strength. Aliasing artifacts result when the NMR signals produced by spins at the spatial extremes of the image undergo a phase shift whose absolute value is greater than 180° between samples. For example, a phase shift in the signal of 185° produced by spins located at the extreme right side of the image is interpreted by the reconstruction process as emanating from spin located on the left side of the image where the phase shift is −175°. As a result, the spin density is misplaced, or "aliased", in the reconstructed image. The aliasing problem in the read-out gradient direction can be significantly reduced by limiting the bandwidth of the acquired NMR signals to those below the Nyquist frequency of the sampling, such that components produced by spins at the extremes are filtered out and do not appear in the reconstructed image.

SUMMARY OF THE INVENTION

The present invention relates to an NMR pulse sequence in which a first NMR signal is acquired with a first bandwidth and magnetic field gradient which reduces chemical shift artifacts, and a second NMR signal is acquired at a later time with reduced bandwidth and a reduced magnetic field gradient which improves the signal-to-noise ratio. The first NMR signal may be produced with minimum delay (TE$_{min}$) and the chemical shift artifacts which present a greater problem at short echo delay time intervals is minimized. The signal-to-noise ratio is not a great problem at short delay times, but becomes more important and is reduced when the second NMR signal is acquired later. Conversely, the chemical shift artifact problem diminishes with time because the $T_2$ of lipids is relatively short and the off resonance NMR signals which they produce are much less significant when the second NMR signal is acquired.

Another aspect of the present invention is the manner in which the effective bandwidth of the acquired NMR signals can be changed during a pulse sequence to improve the SNR of the image without changing the bandwidth of the anti-aliasing filter. This is achieved by changing the sample rate of the analog-to-digital converter and the duration of time over which the samples in the two NMR signals are acquired. More specifically, the bandwidth of the encoded second NMR signal is reduced by reducing the read-out gradient amplitude and proportionately increasing the time over which the second NMR signal is acquired. The sampling rate can then be reduced to yield a Nyquist frequency below the noise bandwidth of the anti-aliasing filters without deleterious effects.

A general object of the invention is to provide an NMR pulse sequence in which the advantages of acquiring both narrow bandwidth and broad bandwidth NMR signals can be achieved. Multiple NMR echo signals are produced in a conventional manner and the bandwidth of the encoded NMR data is varied by changing the magnitude of the read-out gradient and the data acquisition period to maintain the desired field of view and spatial resolution.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
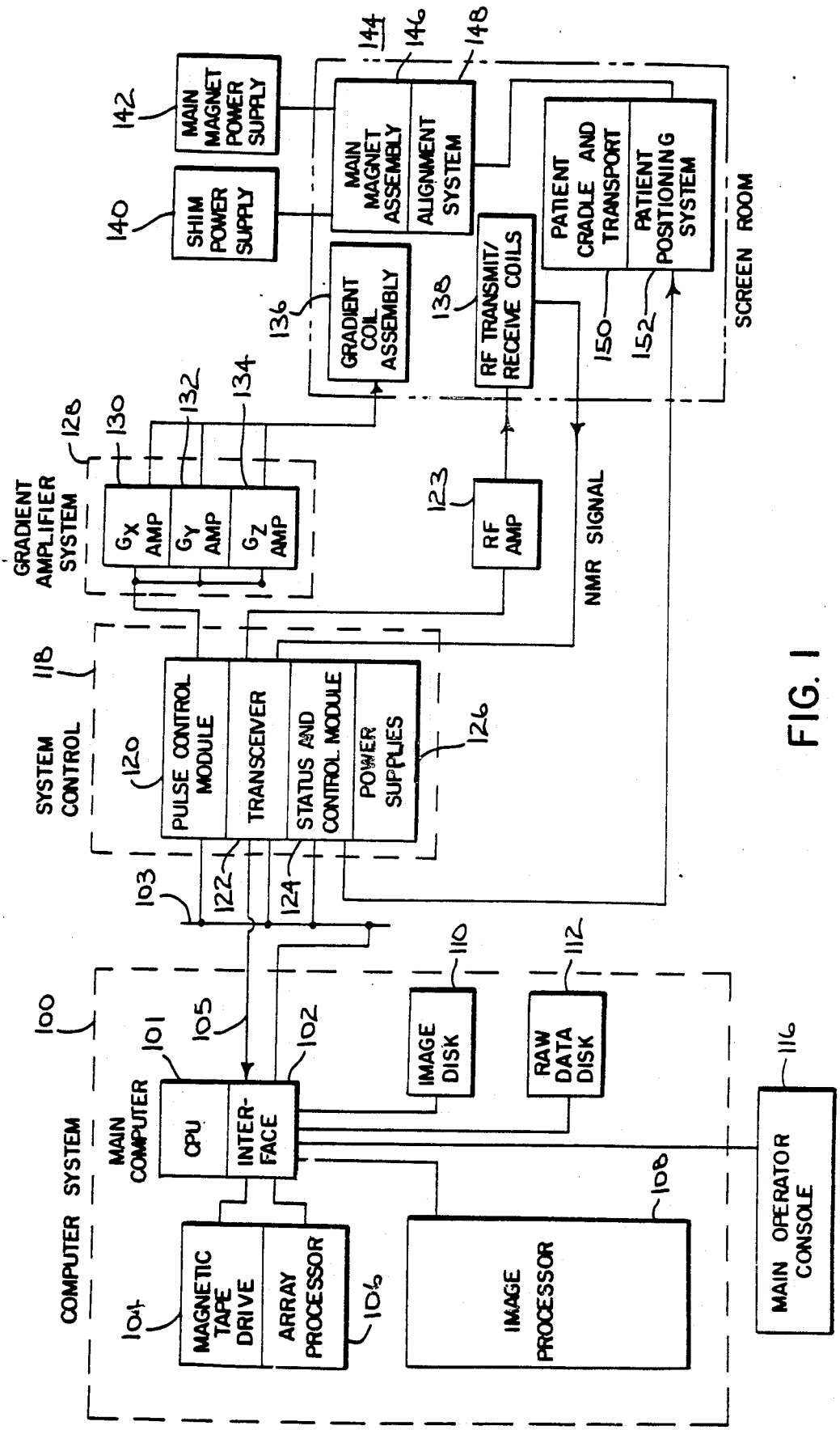
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV4000). The computer 100 includes an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for preprocessing data and for image reconstruction. The function of image processor 108 is to provide interactive image display manipulation such as magnification, image comparison, gray-scale adjustment and realtime data display. The computer system 100 is provided with a means to store raw data (i.e. before image construction) which includes a disc data storage system 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of system control 118 and gradient amplifier system 128. The computer 100 communicates with system control 118 by means of a serial digital communication network 103 (such as the Ethernet network) in a manner well known to those skilled in the art. The system control 118 includes several subsystems such as pulse control module (PCM) 120, a radio frequency transceiver 122, a status control module (SCM) 124, and the power supplies 126. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 excites a corresponding gradient coil in an assembly 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coils 138 which are situated within main magnet assembly 146. The NMR signals radiated by the excited nuclei in the patient are sensed by the same or a different RF coil than is used for transmitting. The signals are detected, amplified, demodulated, filtered, and digitized in the receiver section of the transceiver 122. The processed signals are transmitted to the main computer 101 for processing by means of a dedicated, unidirectional, high-speed digital link 105 which connects interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as an Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. The main magnet power supply 142 is utilized to bring the polarizing field produced by the superconductive magnet to the proper operating strength of 1.5 Tesla and is then disconnected. The patient alignment system 148 operates in combination with a patient cradle and transport system 150 and patient positioning system 152.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room. A bidirectional attenuation of approximately 100 db. is typical in the 63 MHz to 64 MHz frequency range of operation.

Figure 2:
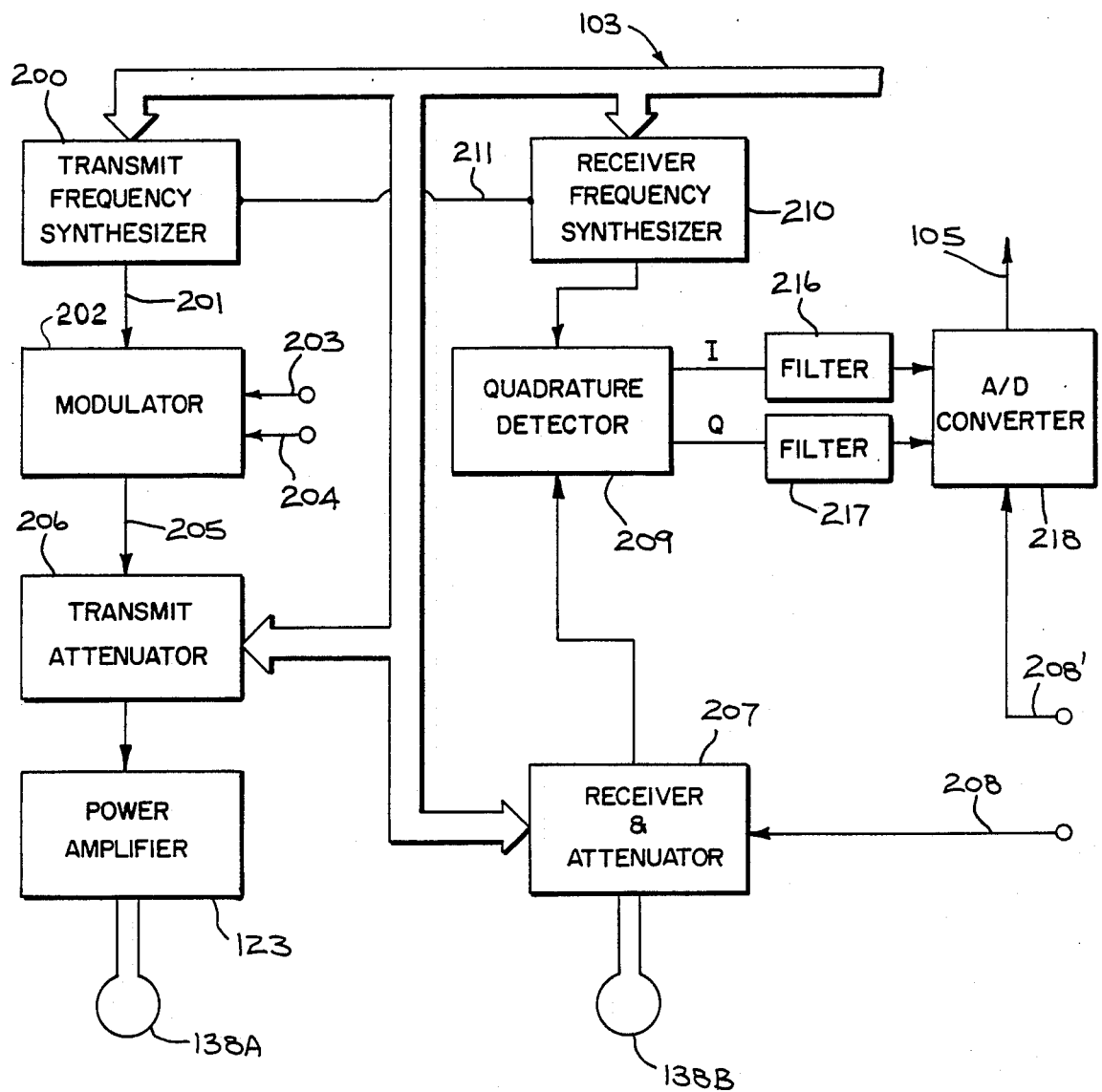
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A, and components which receive the resulting NMR signal induced in a coil 138B. The base, or carrier, frequency of the RF excitation field is produced by a frequency synthesizer 200 which receivers a set of digital signals (CF) through the communications link 103 from the main computer 101. These digital signals indicate the frequency which is to be produced at an output 201 at a resolution of one Hertz. The commanded RF carrier is applied to a single sideband modulator 202 where it is frequency and amplitude modulated in response to signals received through line 203. The resulting RF excitation signal is turned on and off in response to a control signal from the PCM 120 received through line 204. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A.

Referring still to FIGS. 1 and 2, the NMR signal produced by the subject is picked up by the receiver coil 138B and applied to the input of a receiver 207. The receiver 207 amplifies the NMR signal and this is then attenuated by an amount determined by a digital attenuation signal (RA) received from the main computer 101 through line 103. The receiver 207 is also turned on and off by a signal through line 208 from the PCM 120 such that the NMR signal is acquired only over the time intervals required by the particular acquisition being performed. As will be explained in more detail below, the variation in the duration of the data acquisition period is one aspect of the present invention.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the transmitter RF carrier and the amplitude of the component of the NMR signal which is in quadrature therewith. The frequency synthesizer 210 receives digital signals (CF) through the link 103 which determine the frequency of the demodulation signal. The phase of the two synthesizers 200 and 210 is locked together through a line 211, and in most measurements, the frequency of the two synthesizers is the same.

The filters 216 and 217 have a frequency cut off of 16 kHz, which corresponds to an RF bandwidth of ±16 kHz, about the carrier frequency for a total bandwidth of 32 kHz. The A/D converters are enabled by the control line 208' to produce digitized NMR data only when a valid signal is present. The signal on control line 208' not only determines the data acquisition period, but it also determines data acquisition rate. It is a pulse train whose rate determines the rate at which the acquired NMR signal is digitized by the A/D converter 218. As will be explained in more detail below, the control of this acquisition rate is another aspect of this invention. This digitized data is output to the main computer 101 through line 105.

Figure 3:
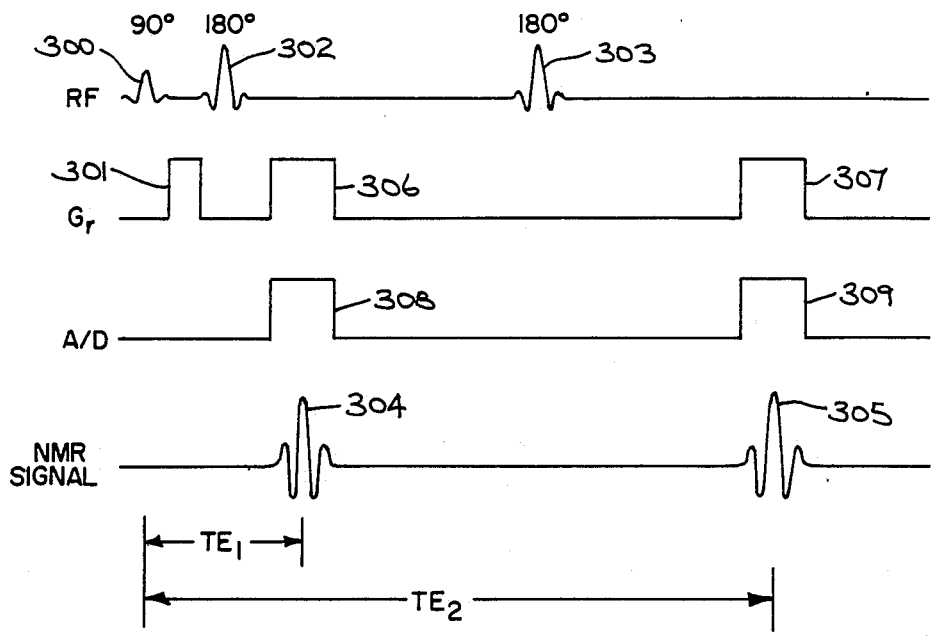
FIG. 3 is a graphic presentation of a conventional pulse sequence.

Referring particularly to FIG. 3, a conventional asymmetric, multiecho pulse sequence is shown in which spin is excited by a 90° RF excitation pulse 300 and then subjected to a "prewinder" magnetic field gradient pulse 301. At a time $TE_1/2$ after the excitation pulse 300, a first 180° RF excitation pulse 302 is applied, and at a time $(TE_2+TE_1)/2$, a second 180° RF excitation pulse 303 is applied. As a result, a first NMR echo signal 304 is produced at the time $TE_1$ and a second NMR echo signal 305 is produced at the time $TE_2$. "Readout" gradient pulses 306 and 307 are applied during the generation of the two echo signals 304 and 305 to frequency encode the signals which are acquired. The bandwidth of the encoded NMR signal is proportional to the product of the read-out gradient amplitude and the size of the imaged object in the direction of the read-out gradient. The spatial resolution of the reconstructed image in the direction of the read-out gradient is inversely proportional to the product of the read-out gradient strength and the total width of the NMR signal acquisition window. The maximum size of the object which can be imaged without aliasing in the read-out gradient direction is inversely proportional to the product of the read-out gradient amplitude and the dwell time between the taking of samples by the A/D converter 218.

In the conventional multiecho sequence of FIG. 3, the read magnetic field gradient pulses 306 and 307 are identical in magnitude and duration. In addition, the A/D converters 218 sample the NMR signals over the same time period as indicated at 308 and 309 and at the same 64 kHz sampling rate. The 64 kHz sampling rate more than satisfies the Nyquist criterion with respect to the 16 kHz bandwidth of the anti-aliasing filters 216 and 217 (FIG. 2). A total of 512 sample pairs are taken of each NMR echo signal 304 and 305. This oversampling is done to prevent aliasing of frequency components just outside the bandwidth of the anti-aliasing filters 216 and 217. After Fourier transformation of the acquired data, the center 256 complex points are used to construct a 256 by 256 pixel image. As can be well appreciated, the outside 128 complex points on each side contain data outside the bandwidth of the anti-aliasing filters 216 and 217 and are of no interest.

The signal-to-noise ratio of an NMR image can be improved if the effective bandwidth is narrowed. This is usually accomplished by reducing the amplitude of the read-out gradient to encode the positions into a narrower bandwidth and widening the read-out gradient pulse to produce the same spatial resolution. The anti-aliasing filters are narrowed to match the reduced bandwidth and the A/D sample rate is reduced to acquire the same number of samples over the longer read-out gradient pulse. The SNR improvement is proportional to the square root of the bandwidth reduction.

The increase in SNR is accompanied by two disadvantages. First, the minimum echo delay ($TE_{1min}$) for the first NMR echo signal 304 is increased due to the widening of read-out gradient pulse 306. In fact, this delay is twice what might be expected, since the time between the 90° RF excitation pulse 300 and the 180° RF excitation pulse 302 must also be increased to orient the NMR echo signal 304 at the center of the widened read-out gradient pulse 306. The lengthening of $TE_1$ is a disadvantage when $T_2$ weighting of the NMR image is not desired.

A second disadvantage which accompanies this increase in SNR is an increase in chemical shift artifacts.

Since the bandwidth per image pixel is reduced, the frequency difference between lipid and water resonances becomes more significant. For example, a 220 Hertz difference in resonance will appear further apart in an image where each image pixel represents a difference in frequency of 42 Hertz rather than 125 Hertz. The result is relative displacement of the lipid signal and it is more disturbing with images reconstructed from the first NMR echo signal 304 since the second echo signal 305 has lower lipid signal components due to the shorter $T_2$ decay time of lipids.

The present invention is a method and means for acquiring a wide bandwidth first NMR echo signal and a narrow bandwidth second NMR echo signal in the same pulse sequence. The improved SNR is not as important with the first NMR echo signal because the signal strength has not decayed to the same extent as the second NMR echo signal. On the other hand, the effects of chemical shift artifacts are reduced in the first NMR echo signal which is often used for anatomical definition and which contains more lipid signals. The technique is called variable bandwidth multiecho imaging.

Figure 4:
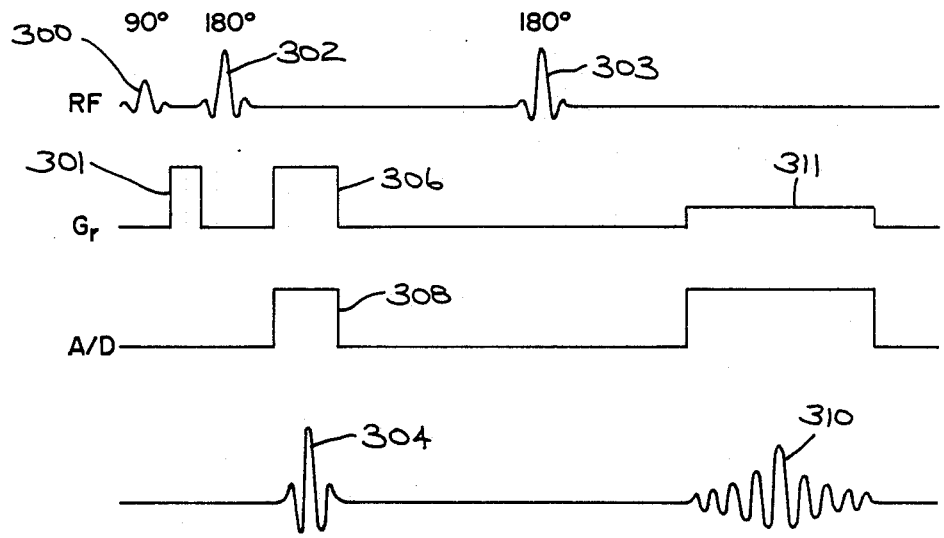
FIG. 4 is a graphic presentation of a pulse sequence according to the present invention.

Referring particularly to FIG. 4, the improved pulse sequence contains the same RF excitation pulses 300, 302 and 303. The first NMR echo signal 304 is acquired as described above to produce 512 samples at a 64 kHz sample rate. However, when the second NMR echo signal 310 is produced, the read-out gradient pulse 311 is reduced in amplitude by (e.g. one-third the amplitude of the read-out gradient pulse 306) and it is widened by 1/x (e.g. three times the width of pulse 306). The second NMR echo signal 310 thus evolves over a longer acquisition period during which the A/D converter takes 512 samples at a rate reduced by x (e.g. at a 21.3 kHz sample rate). As a result, the imaging bandwidth is effectively reduced by x (e.g. to ±5.3 kHz) and the signal-to-noise ratio of the acquired signal improves by a factor of $\sqrt{1/x}$ (e.g. $\sqrt{3}$).

In one embodiment of the invention, the pulse sequence is accompanied by a change in the NMR system hardware. Specifically, the anti-aliasing filters 216 and 217 have a variable bandwidth which can be controlled by signals from the pulse control module 120. In the pulse sequence of FIG. 4, the PCM 120 sets the bandwidth of the filters 216 and 217 to a value which precludes aliasing during the acquisition of the first NMR echo signal 304 and then reduces the bandwidth by a factor of x during the acquisition of the second NMR echo signal 310.

When the bandwidth of the anti-aliasing filters 216 and 217 cannot be changed during the execution of the pulse sequence, an alternative method is available. In the above described NMR system, the 64 kHz sampling rate employed during the acquisition of the first NMR echo signal 304 is twice that required by the Nyquist criterion for operation with the 16 kHz bandwidth anti-aliasing filters 216 and 217. As will now be described, this oversampling can be used to practice the variable bandwidth multiecho imaging of the present invention.

Figure 5:
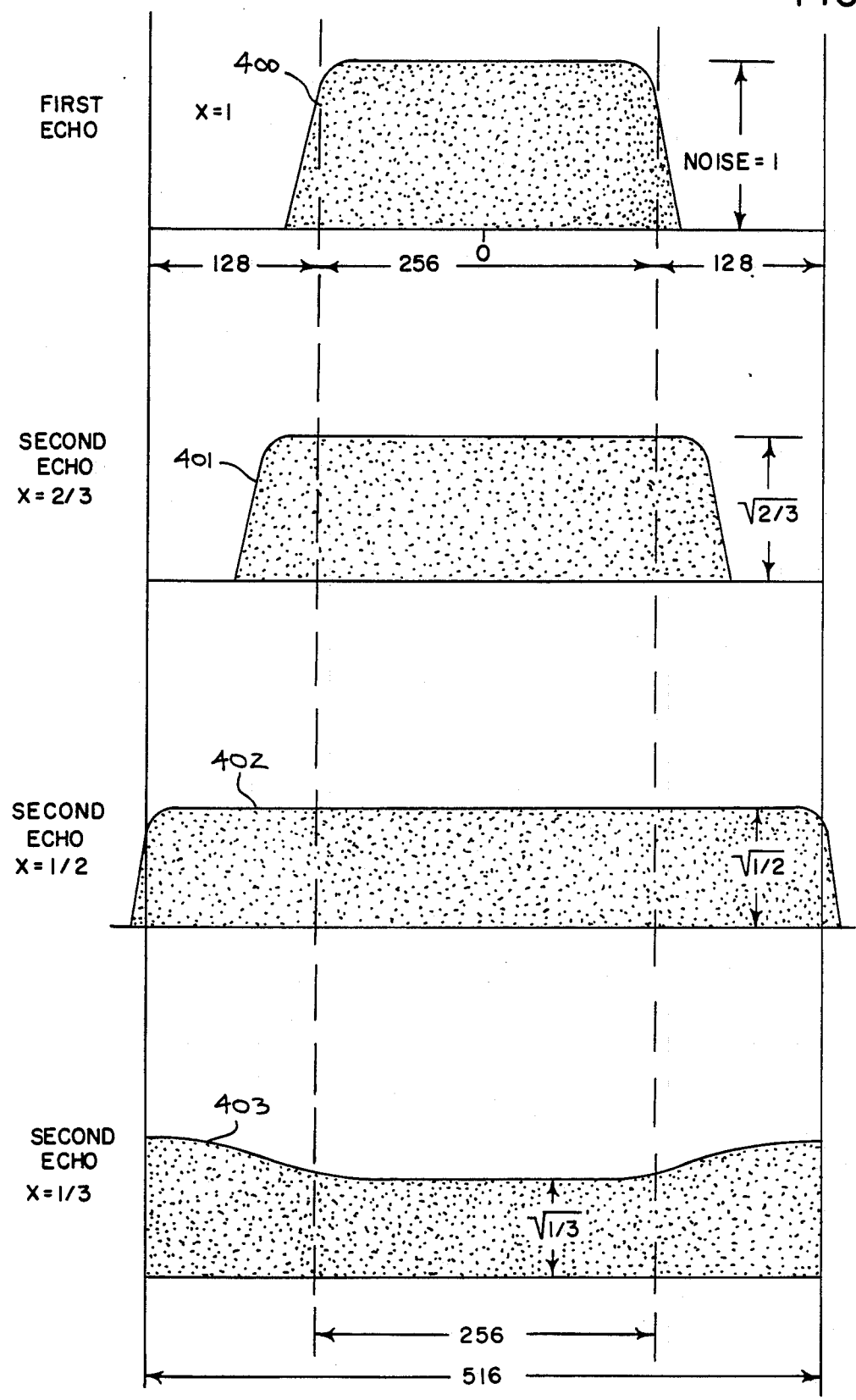
FIG. 5 is a graphic representation of the effects of bandwidth narrowing in accordance with the present invention.

Referring particularly to FIG. 5, the first NMR echo signal is sampled at a rate of 64 kHz and 512 samples are acquired. As shown by the curve 400, the anti-aliasing filters 216 and 217 rolloff at a frequency (16 kHz) which corresponds to the bandpass of the central 256 image pixels. As a result, there is very little signal or noise in the outer 128 image pixels. If the sampling rate and the read-out gradient amplitude are decreased by a factor of x and the acquisition time and read-out gradient pulse width are widened by 1/x, the fixed 16 kHz bandwidth of the anti-aliasing filters 216 and 217 encompass more of the 512 image pixels shown in FIG. 5. This is illustrated by the respective curves 401-403 for values of x of ⅔, ½ and ⅓, respectively. As the value of x decreases, more energy appears in the outer 128 image pixels until the anti-aliasing filters 216 and 217 become exactly matched to the 512 sample encoding bandwidth of the acquired NMR signals at x=½. At this point, the NMR signal is no longer oversampled, and as x is reduced further, the anti-aliasing filters 216 and 217 no longer limit the frequencies of the acquired NMR signals sufficiently to prevent aliasing. This is illustrated by the curve 403 which rises in value in the outer 128 image pixel regions due to the aliasing of signals. Note, however, that the central 256 image pixel region which is used in the final image is only slightly affected by aliasing even when x is reduced to ⅓.

The heights of the curves 400-403 illustrate what happens to random noise as x is reduced. When the first echo is acquired, all of the random noise is limited to the central 256 image pixels. As x is reduced however, more of this noise energy appears in the outer 128 pixel regions and the noise level within the central 256 pixel region drops by the indicated amounts. It is important to understand, however, that because the read-out gradient is reduced by the same factor as the sampling rate, the field of view of the object under study remains the same size. That is, if the object is contained within the central 256 image pixels for the first NMR echo signal, it will remain unchanged in size in the images produced by the second narrower bandwidth NMR echo signals.

One skilled in the art will appreciate that the invention can be practiced with acquisition of more than two echoes, as well as with acquisition of gradient echoes rather than spin echoes.

I claim:

1. A method for acquiring NMR data from nuclei in a region of interest, the steps comprising:
    applying a polarizing magnetic field in the region of interest;
    applying an RF excitation field pulse to the nuclei in the region of interest to produce transverse magnetization;
    refocusing the transverse magnetization at a time $TE_1$ after the application of the RF excitation field pulse to produce a first NMR echo signal;
    acquiring the first NMR echo signal in the presence of a read-out magnetic field gradient with a receiver and limiting the frequency bandwidth of the received first NMR echo signal to a first value;
    refocusing the transverse magnetization at a time $TE_2$ after the application of the RF excitation field pulse to produce a second NMR echo signal; and
    acquiring the second NMR echo signal in the presence of a reduced read-out magnetic field gradient with the receiver and limiting the frequency bandwidth of the received second NMR echo signal to a second value which is less than the first value by increasing the duration of the acquisition of the second NMR echo signal and decreasing the rate at which the second NMR echo signal is sampled and digitized such that the signal-to-noise ratio of the received second NMR echo signal is increased, and wherein the first NMR echo signal is oversampled to acquire signals outside the region of interest in the direction of the read-out magnetic field gradient.

2. The method as recited in claim 1 which includes filtering the acquired first NMR echo signal to reduce the signals from outside the region of interest.

* * * * *